US005773364A

United States Patent [19]
Farkas et al.

[11] Patent Number: 5,773,364
[45] Date of Patent: Jun. 30, 1998

[54] METHOD FOR USING AMMONIUM SALT SLURRIES FOR CHEMICAL MECHANICAL POLISHING (CMP)

[75] Inventors: Janos Farkas, Austin; Melissa Freeman, Round Rock, both of Tex.

[73] Assignee: Motorola, Inc., Schaumburg, Ill.

[21] Appl. No.: 734,566

[22] Filed: Oct. 21, 1996

[51] Int. Cl.$^6$ ..................................................... H01L 21/00
[52] U.S. Cl. ..................... 438/692; 252/79.1; 438/693; 438/754; 451/287
[58] Field of Search ........................... 252/79.1; 438/754, 438/692, 693; 451/287

[56] References Cited

U.S. PATENT DOCUMENTS 5,527,423  6/1996  Neville et al. ........................ 156/636.1

OTHER PUBLICATIONS

F.B.Kaufman, et al., "Chemical–Mechanical Polishing for Fabricating Patterned W Metal Features as Chip Interconnects", J.Electrochem, Soc., vol. 138, No. 11, Nov. 1991, pp. 3460–3465.

Janos Farkas, et al., "Oxidation and Etching of Tungsten In CMP Slurries",Advanced Metallization for ULSI Application 1994, Material Research Scientist Symposium Proceeding 1994, Pittsburgh, PA, pp. 1–8.

Primary Examiner—Yogendra N. Gupta
Attorney, Agent, or Firm—Keith E. Witek; J. Gustav Larson

[57] ABSTRACT

A method for chemical/mechanical polishing (CMP) uses a slurry (22). This slurry (22) contains one or more ammonium salts, such as ammonium nitride ($NH_4NO_3$), as an oxidizing/etching species within the slurry (22). This slurry (22) is used to polish a metal layer (14) whereby the ammonium salt does not create slurry distribution problems, does not contain metallic species, does not contain mobile ions like potassium, and is environmentally safe.

29 Claims, 3 Drawing Sheets

METHOD FOR USING AMMONIUM SALT SLURRIES FOR CHEMICAL MECHANICAL POLISHING (CMP)

FIELD OF THE INVENTION

The present invention relates generally to semiconductor manufacturing, and more particularly, to using ammonium salts as a oxidizer/etcher species in chemical mechanical polishing (CMP) of metals.

BACKGROUND OF THE INVENTION

Chemical mechanical polishing (CMP) is well known in the art of semiconductor manufacturing. Processes for manufacturing semiconductor devices often include a chemical mechanical polishing (CMP) step to improve planarity of layer and/or to define conductive interconnects. A commonly-used CMP process utilizes abrasive particles that are suspended in a colloidal slurry. Different additives or agents can be combined with the slurry to improve the polishing rate and the selectivity of the slurry. As an example, various ionic salts such as iron nitrate $(Fe)NO_{3(3)}$ or hydrogen peroxide, can be used as an oxidizing/etching reagent for metal CMP processes. Other reagents can also be combined with the slurry to improve the transport or rheological properties of the slurry, and still other reagents can be mixed into the slurry to inhibit the corrosion of the surface being polished. A number of the additives, or reagents, are known in the prior art.

Several oxidizing/etching reagents are know. A first type of oxidizing/etching reagent used in the CMP slurry contains metal. Examples of such agents would be potassium ferric cyanide, ferric nitrate, or cerium nitrate. A problem with the metal-based reagents is that metal ions are created as a result of the oxidizing process. These metal ions can contaminate an exposed surface of a semiconductor wafer which could affect the reliability and functionality of semiconductor devices on the wafer. In addition, these metallic species will coat/stain the CMP equipment which creates particulate problems and reduces the life cycle of the CMP equipment. This in turn causes increased replacement of polishing equipment and greater cost associated with the manufacturing process.

A second type of oxidizing/etching reagent used in CMP slurries contains potassium (K). Examples of such oxidizing/etching reagents will be potassium iodate, or potassium ferric cyanide. A problem with the potassium-based reagents is that the potassium ion is present in the slurry as a reaction product of the CMP process. Potassium is highly mobile ion in dielectric layers of semiconductor devices. The increased incorporation of potassium into substrate layers may increase leakage current in a final manufactured devices. Therefore, potassium ions can degrade integrated circuit (IC) reliability.

A third type of reagent used as a portion of the slurry are those reagents which are inherently unstable and cause slurry delivery problems. Examples of such reagents would be hydrogen peroxide $(H_2O_2)$. Hydrogen peroxide can decompose to $H_2O$ and $O_2$. This reaction may be further accelerated by the slurry pumps within the slurry delivery system. The liberated $O_2$ can create excess pressure in the slurry delivery system resulting in failure and/or hazardous operating conditions.

A fourth type of reagent used in the slurry would be that being highly alkaline or highly acidic. An example of a highly acidic reagent is nitric acid. Extremely high or extremely low pH values (e.g. below 1 or above 11) will be detrimental to the colloidal stability of the slurry. Therefore, the use of a highly alkaline or highly acidic reagents is not advantageous since a small amount of change in the concentration of these reagents creates a large shift in pH.

Many of the above discussed oxidizing/etching reagents are detrimental to the environment (such as potassium ferric cyanide, cerium nitrate, and ferric nitrate) and/or costly (such as cerium nitrate).

Therefore, a need exists for a new oxidizing/etching reagent which reduces metallic contamination, avoids staining/coating of CMP equipment, does not contain mobile ions, is safe and easy to deliver, and compatible with stable colloidal suspensions. In addition, a new oxidizing/etching reagent that is more cost effective and easier to dispose of in an environmentally-safe manner would be desirable.

Figure 1:
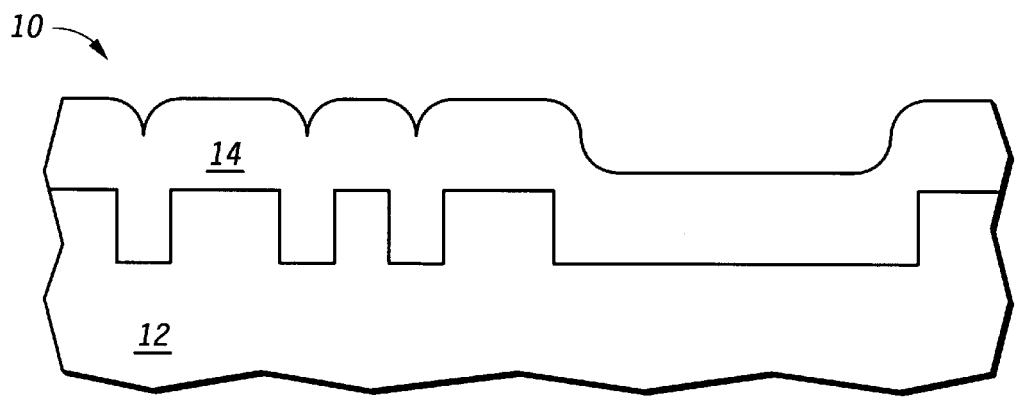
FIGS. 1–6 illustrate, in cross-sectional form, a method for polishing a conductive layer using an ammonium salt slurry in accordance with the present invention.

It will be appreciated that for simplicity and clarity of illustration, elements illustrated in the FIGURES have not necessarily been drawn to scale. For example, the dimensions of some of the elements are exaggerated relative to other elements for clarity. Further, where considered appropriate, reference numerals have been repeated among the FIGURES to indicate corresponding or analogous elements.

DESCRIPTION OF A PREFERRED EMBODIMENT

Generally, the present invention involves using ammonium salts as an oxidizing/etching species within the slurry of a chemical mechanical polishing (CMP) system for polishing metals. Many ammonium salt species do not contain metallic species so that the ammonium salts will not significantly stain/coat CMP equipment. In addition, due to the lack of metallic species, a top surface of the silicon wafer will not be contaminated by the slurry containing ammonium salt(s). Furthermore, the ammonium salt species taught herein do not contain potassium, or similar mobile ions, which can diffuse readily through dielectric materials. Therefore, integrated circuit (IC) reliability can be improved by using the slurry taught herein. In addition, the ammonium salts taught herein are not difficult to distribute, and do not suffer the distribution problems experienced by hydrogen peroxide. Ammonium salt slurries are relatively inexpensive when compared to other slurries used in the prior art. Also, ammonium salts are environmentally safe and can be easily disposed of after use. In summary, the use of ammonium based salts as an oxidizer/etcher agent within a CMP slurry renders significant improvements over the prior art.

The present invention can be further understood with reference to FIGS. 1 through 6. FIG. 1 illustrates a semiconductor device 10. Semiconductor device 10 comprises a substrate 12. Substrate 12 is typically a semiconductor substrate including, but not limited to, silicon, germanium, gallium arsenide, a silicon on insulator substrate (SOI), III–V and II–IV compound semiconductor substrates, dielectric substrates (PZT, $SiO_2$), and/or the like. Substrate 12 further comprises dielectric layers and conductive layers over a substrate as are necessary to form active and passive devices of one or more integrated circuits (ICs).

Various lithographically-defined features can be patterned and etched in a top portion of the dielectric layers which form a top portion of the substrate 12 in FIG. 1. The geometries which can be etched into these top dielectric layers of substrate 12 include contact vias, interconnect trenches, dual inlaid structures (dual damascene process), and like inlaid structures. After formation of these features, a conductive layer 14 is formed over the substrate 12. Conductive layer 14 can be made of conductive nitride material, refractory metals, refractory silicides, copper, silver, gold, aluminum, platinum, and/or the like. Due to the underlying inlaid structures or contacts, the conductive layer 14 is deposited such that a top surface of the conductive layer 14 is not planar. Planarization in forming a co-planar surface on layer 14 is necessary in order to form the inlaid contact and/or interconnects.

Figure 2:
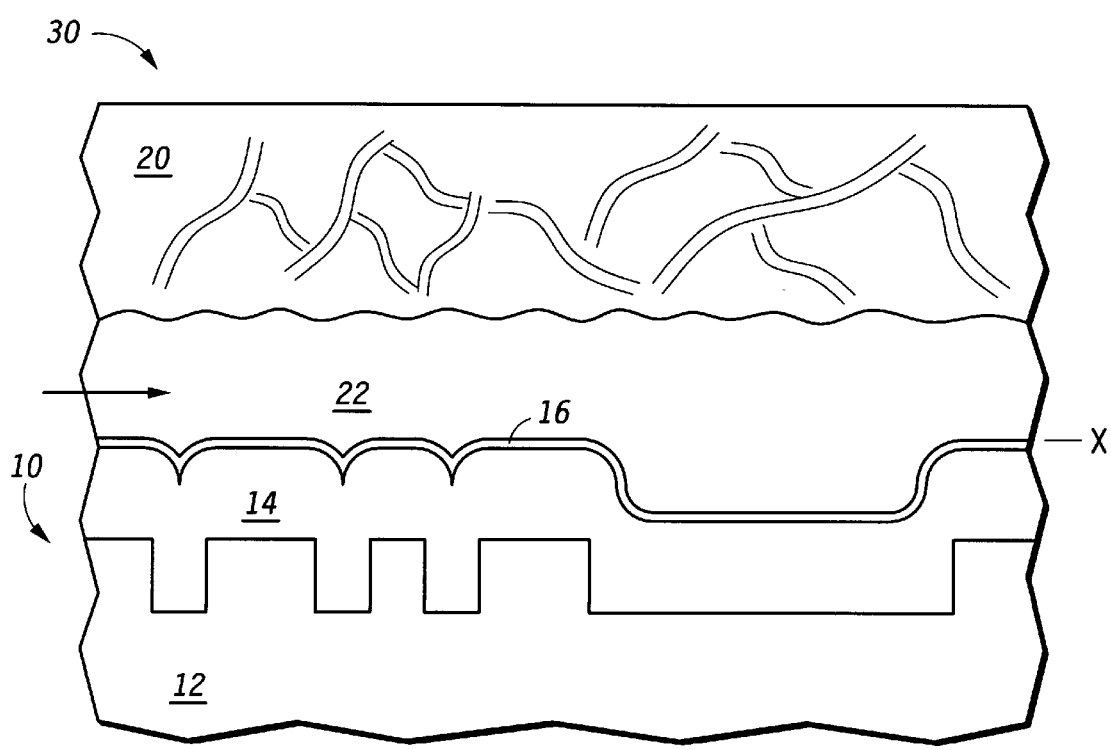

In order to define interconnect structures and contacts/plugs from the conductive layer 14, a chemical mechanical polishing (CMP) technique is utilized in FIGS. 2 through 6. FIG. 2 illustrates that a slurry 22 is applied over a top surface of the conductive layer 14. The slurry contains one or more species which enables the polishing of the conductive layer 14. In general, the slurry 22 can contain an aqueous suspension of one or more type of abrasive species, oxidizer/etchers species, oxidizer species, etchers species, and additives such as corrosion inhibitors, selectivity enhancers, and slurry transport enhancing additives.

A moving polishing surface 20, which is preferably a rotatable polishing pad, is placed in contact with the slurry 22 as illustrated in FIG. 2. The polishing pad 20 provides mechanical support during the polishing process illustrated in FIGS. 2 through 6, and provides sufficient slurry transport in the system 30. Polishing pad 20 is typically made of a polymers of which polyurethane is common. It is immaterial whether the polishing surface is moving or whether the wafer is moving as long one of either the wafer or the polishing surface is moving with respect to one another.

In a preferred form, the slurry 22 illustrated in FIG. 2 contains ammonium salts as the oxidizer/etcher species. In a most preferred form, the slurry 22 contains ammonium nitrate $NH_4NO_3$ as the oxidizer/etcher species. The ammonium nitrate oxidizer/etcher species in slurry 22 creates a high polishing rate of aluminum and copper, does not contain metal which contaminates integrate circuit surfaces and stains equipment, is easy to distribute and dispose from an integrated circuit facility, is highly soluble in water, provides a high concentration of both positive and negative ions in a broad pH range, does not provide species which diffuse substantially into dielectric layers of an integrated circuit, is cost effective, and is environmentally safe.

Although ammonium nitrate is preferred, any mono-basic ammonium salt can be used in place of ammonium nitrate in the slurry 22 taught herein. For example, ammonium phosphate ($NH_4PO_3$), ammonium sulfate ($NH_4SO_4$), ammonium iodate ($NH_4IO_3$), ammonium periodate ($NH_4IO_4$), and/or the like may be used in the slurry 22.

In a next preferred category, di-basic ammonium salts can be utilized in place of the ammonium nitrate in the slurry 22 of FIG. 2. These di-basic ammonium salts include, but are not limited to, ammonium citrate (($NH_4)_2CH_6H_5O_7$), ammonium oxalate (($NH_4)_2C_2O_4$), ammonium sulfate (($NH_4)SO_4$), ammonium carbonate (($NH_4)_2CO_3$), ammonium iodide ($NH_4I$), and ammonium tartarate (($NH_4)_2C_4H_4O_6$), and the like.

In yet another least preferred form, ammonium salts which contain metallic species may also be used as the etcher/oxidizer species within the slurry 22 of FIG. 2. These metallic containing mono-basic salts include, but are not limited to, ammonium aluminum sulfate ($NH_4Al(SO_4)_2$), ammonium cerium nitrate ($NH_4Ce(NO_3)_6$), ammonium cerium sulfate ($NH_4Ce(SO_4)_4$), ammonium iron oxalate ($NH_4Fe(C_2O_4)_3$), ammonium iron sulfate ($NH_4Fe(SO_4)_2$), and the like.

From this point on, FIG. 2–FIG. 6 will be discussed assuming that the etchings/oxidizing species of the slurry 22 is ammonium nitrate. In addition, the following FIGS. 2–6 will be discussed assuming that the conductive layer 14 is one of either copper or aluminum. This restriction in the materials included in the slurry 22 and conductive layer 14 are done to simplify the discussion of the subsequent example. Once the conductive layer 14 is brought in contact with the slurry 22, chemical interaction occurs. The ammonium nitrate which is contained within the slurry 22 will first break down into a positive ammonium $(NH_4)^+$ ion and a negative nitrate ion $(NO_3)^-$.

The nitrate ion and dissolve oxygen which are present in the slurry 22 will oxidize a thin top portion of the conductive layer 14 to form a passivation layer 16 as illustrated in FIG. 2. The pH of the slurry 22 impacts the stability of the passivation layer 16. If the pH of the slurry 22 is such that the thermodynamic stability of layer 16 is low, then an additive or inhibitor can be added to the slurry 22 to enhance the protection of the recessed areas of the conductive layer 14. In addition, slurries containing ammonium nitrate as taught herein can be used in a broad pH range. The pH of the slurry containing ammonium nitrate can be easily adjusted by the addition of either nitric acid or ammonium hydroxide. Therefore, the slurry 22 can be controlled such that the passivation layer 16 prevents chemical or mechanical attack of recessed portions of the layer 14 while top portions of the layer 14 can be removed and planarized. In addition, the nitrate ion will complex removed species from the conductive layer 14 during polishing.

The ammonium ion present in the slurry 22 is used as a counter ion to balance the pH in a slurry 22. The counter ion will allow for high concentration of ion species, and in some circumstances ammonium ion may complex remove species from the slurry 22.

Figure 3:
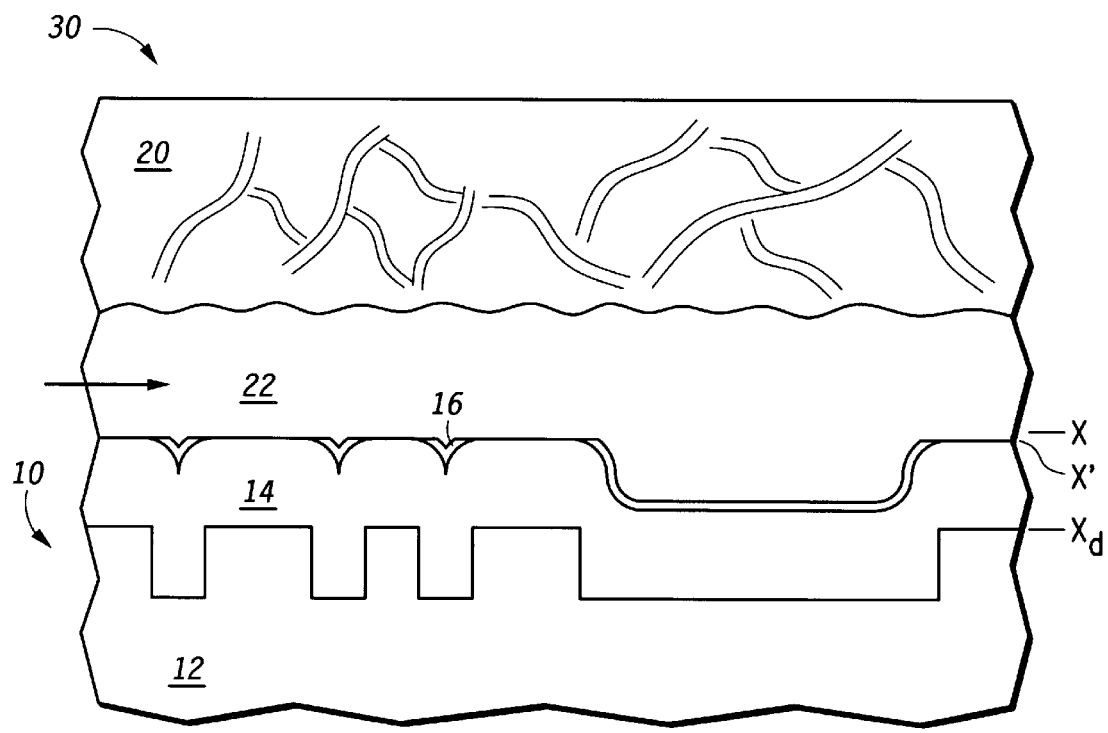

FIG. 3 illustrates that abrasive action within the slurry 22 due to the relative motion of the pad 20 and the substrate 12 removes portions of the passivation layer 16 along top portions of conductive layer 14. In addition to mechanical action, a small portion of the layer 16 may also be removed by chemical reaction. Typically, this removal is accomplished by abrasive particles such as metal oxide within the slurry 22. In yet another form, the polishing pad 20 may contain the abrasive particles which allows for removal of passivation layer 16 as illustrated in FIG. 3. Notice that recessed portions of conductive layer 14 in FIG. 3 are protected from removal by recessed portions of the layer 16. Therefore, FIG. 3 illustrates that the layer 14 has been planarized from a thickness X down to a thickness X'.

Figure 4:
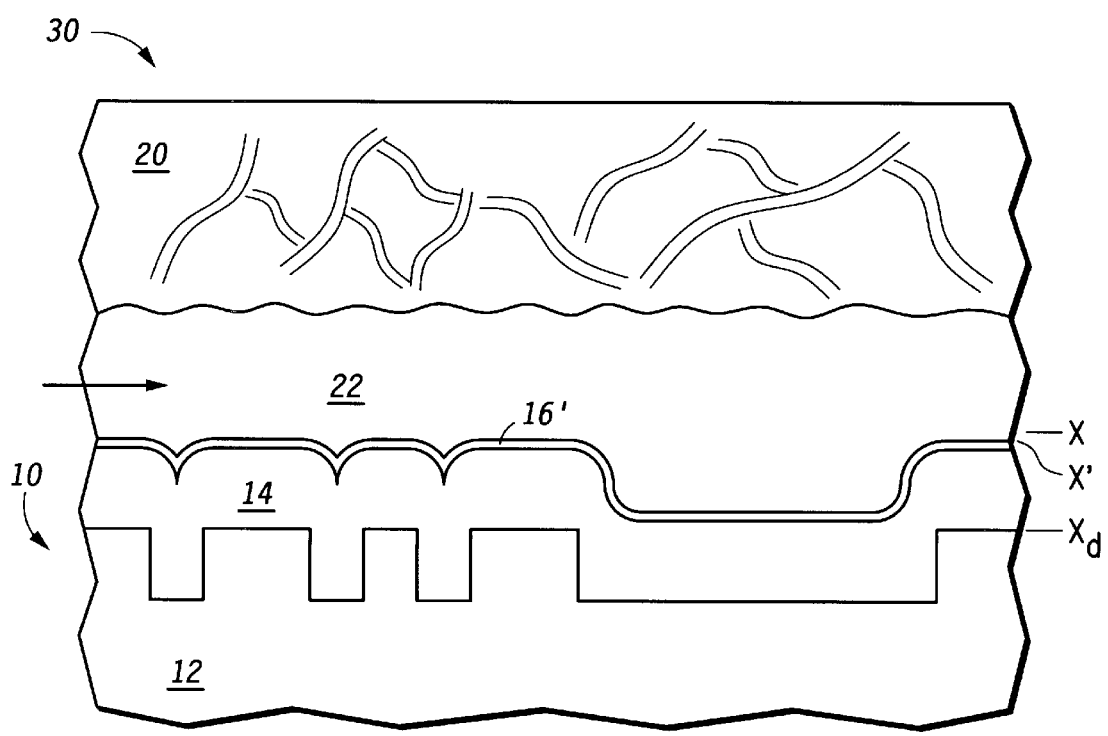

FIG. 4 illustrates that the presence of the oxidizing/etching species in a slurry 22 as previously discussed will reform a passivation layer 16' as illustrated in FIG. 4. The oxidizing species and abrasive species within the slurry 22 iteratively forms and removes the passivation layer 16 and 16' resulting in incremental planarization of a top surface of a layer 14.

Figure 5:
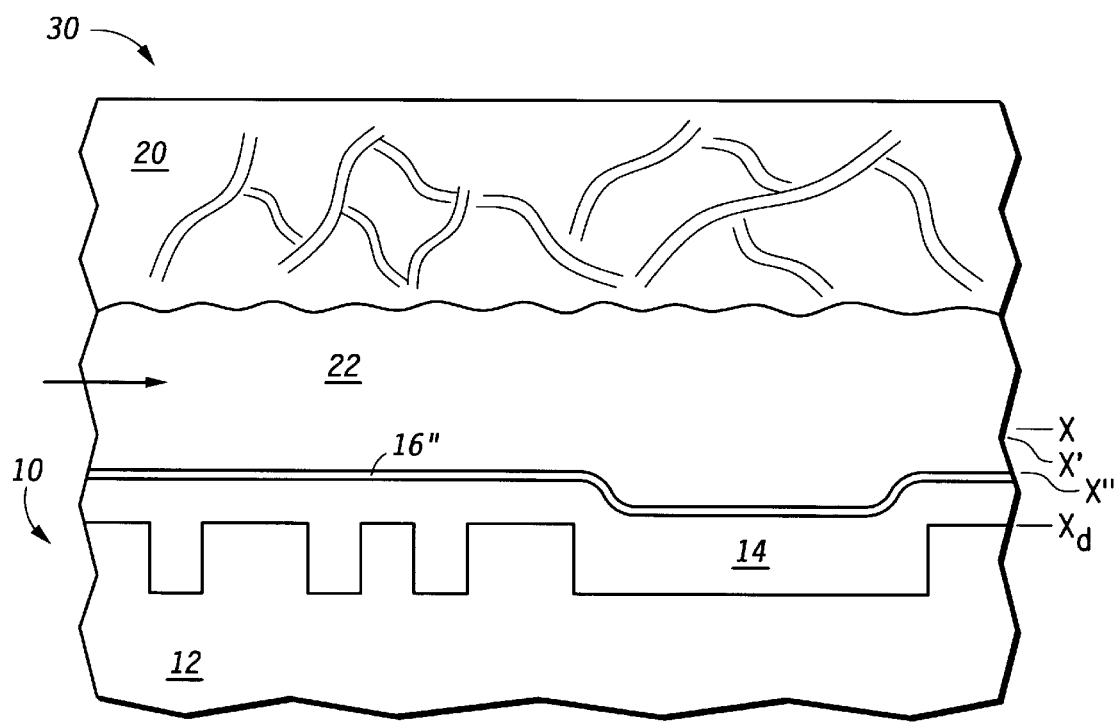
Figure 6:
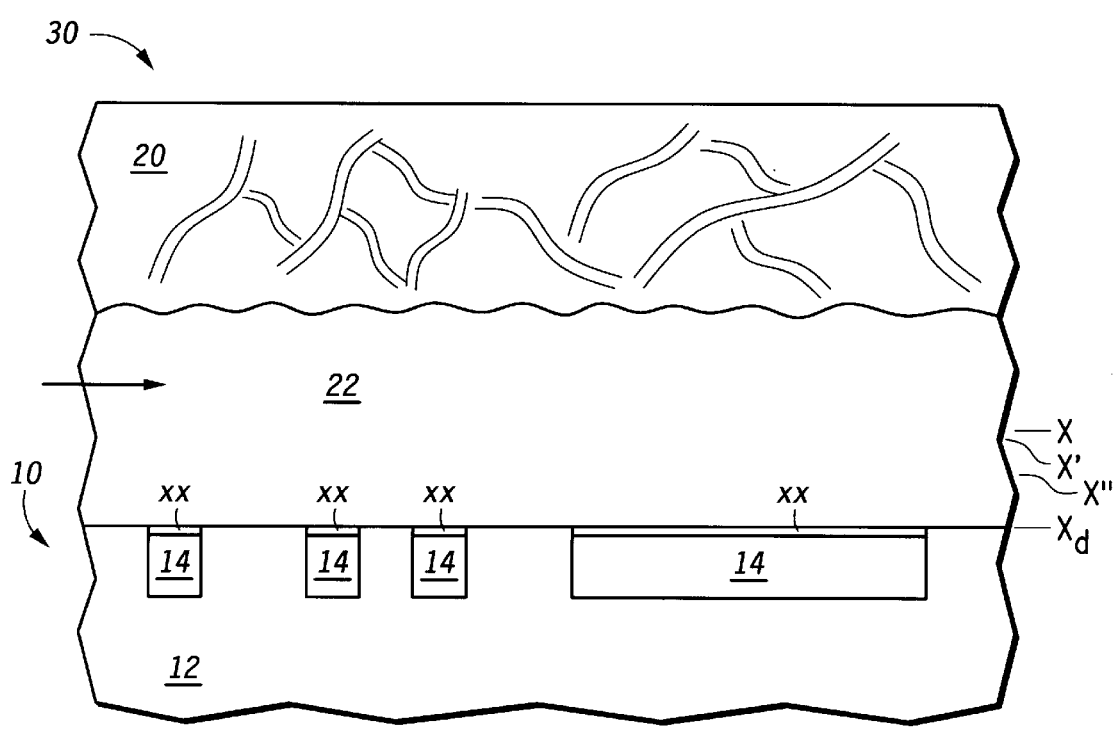

This process of forming and removing the passivation layer while protecting recessed portions of the layer 14 is continued to reduce an overall thickness of the layer 14 as illustrated in FIG. 5. After a specified time period, a co-planar surface of the layer 14 is achieved as illustrated in FIG. 6.

While the present invention has been illustrated and described with reference to specific embodiments, further modifications and improvements will occur to those skilled in the art. It should be realized that any monobasic, dibasic salt containing the ammonium positive ion can be used as the oxidizing/etching reagent as taught herein. It is to be understood, therefore, that this invention is not limited to the particular forms illustrated and that it is intended in the appended claims to cover all modifications that do not depart from the spirit and scope of this invention.

What is claimed is:

1. A method for polishing a semiconductor wafer, the method comprising the steps of:
   providing a polishing surface;
   exposing the polishing surface to a slurry, the slurry containing an mono-basic ammonium salt with exception of ammonium sulfate and ammonium halides;
   moving the polishing surface;
   bringing the semiconductor wafer having a conductive layer into contact with the slurry while the polishing surface is moving; and
   polishing the conductive layer having a top surface wherein the conductive layer is located on an exposed surface of the semiconductor wafer, the mono-basic ammonium salt within the slurry facilitating removal of a top portion of the conductive layer.

2. The method of claim 1 wherein an abrasive species is added to the slurry to facilitate mechanical removal of the exposed surface of the conductive layer.

3. The method of claim 1 wherein the conductive layer has a recessed area, wherein an additive is added to the slurry to inhibit corrosion of the recessed area of the conductive layer.

4. The method of claim 1 wherein the step of polishing further comprises:
   forming a passivation layer on a portion of the top surface of the conductive layer, the passivation layer being formed by an interaction between the mono-basic ammonium salt and the conductive layer.

5. The method of claim 4 wherein the step of polishing further comprises:
   mechanically removing the passivation layer to reduce a total thickness of the conductive layer and render the top surface of the conductive layer substantially planar.

6. The method of claim 4 wherein the step of polishing further comprises:
   chemically removing the passivation layer from to reduce a total thickness of the conductive layer and render the top surface of the conductive layer substantially planar.

7. The method of claim 1 wherein the mono-basic ammonium salt is $NH_4NO_3$.

8. The method of claim 1 wherein the mono-basic ammonium salt is $NH_4NI_4$.

9. The method of claim 1 wherein the mono-basic ammonium salt is $NH_4NI_3$.

10. The method of claim 1 wherein the mono-basic ammonium salt is $NH_4PO_3$.

11. The method of claim 1 wherein the conductive layer substantially comprises copper.

12. The method of claim 1 wherein the conductive layer substantially comprises refractory metal.

13. The method of claim 1 wherein the conductive layer substantially comprises aluminum.

14. The method of claim 1 wherein the conductive layer substantially comprises a conductive nitride.

15. The method of claim 1 wherein the mono-basic ammonium salt is selected from a group consisting of: $NH_4Al(SO_4)_2$, $NH_4Ce(NO_3)_6$, $NH_4Ce(SO_4)_4$, $NH_4Fe(C_2O_4)_3$, and $NH_4Fe(SO_4)_2$.

16. A method for polishing a semiconductor wafer, the method comprising the steps of:
   providing a polishing surface;
   exposing the polishing surface to a slurry, the slurry containing an ammonium salt with exception of ammonium sulfate and ammonium halides which is either mono-basic or di-basic;
   moving the polishing surface;
   bringing the semiconductor wafer into contact with the slurry while the polishing surface is moving; and
   polishing a conductive layer having a top surface wherein the conductive layer is located on an exposed surface of the semiconductor wafer, the ammonium salt within the slurry facilitating removal of a top portion of the conductive layer wherein the conductive layer contains atoms selected from a group consisting of: aluminum and copper.

17. The method of claim 16 wherein the ammonium salt is a dibasic ammonium salt.

18. The method of claim 16 wherein the ammonium salt is a mono-basic ammonium salt.

19. The method of claim 16 wherein the ammonium salt is $NH_4NO_3$.

20. The method of claim 16 wherein the ammonium salt is $NH_4IO_4$.

21. The method of claim 16 wherein the ammonium salt is $NH_4IO_3$.

22. The method of claim 16 wherein the ammonium salt is $NH_4PO_3$.

23. The method of claim 16 wherein the ammonium salt is $(NH_4)_2HC_6H_5O_7$.

24. The method of claim 16 wherein the ammonium salt is $(NH_4)_2C_2O_4$.

25. The method of claim 16 wherein the ammonium salt is $(NH_4)_2CO_3$.

26. The method of claim 16 wherein the ammonium salt is $(NH_4)_2SO_4$.

27. The method of claim 16 wherein the ammonium salt is $(NH_4)_2C_4H_4O_6$.

28. The method of claim 16 wherein the ammonium salt is selected from a group consisting of: $NH_4Al(SO_4)_2$, $NH_4Ce(NO_3)_6$, $NH_4Ce(SO_4)_4$, $NH_4Fe(C_2O_4)_3$, and $NH_4Fe(SO_4)_2$.

29. A method for polishing a silicon wafer having a top metallic layer, the method comprising the steps of:
   providing a polishing pad having a polishing surface;
   exposing the polishing surface to a slurry, the slurry containing an oxidizer/etcher which is $NH_4NO_3$;
   rotating the polishing pad;
   bringing the silicon wafer into contact with the slurry while the polishing surface is rotating;
   rotating the silicon wafer when in contact with the slurry;
   forming, via interaction between the top metallic layer and the $NH_4NO_3$, a passivation layer on a portion of the top metallic layer while the silicon wafer is in contact with the slurry; and
   removing the passivation layer from the top metallic layer via the slurry whereby, over time, the top metallic layer is polished to have a substantially planar top surface.

* * * * *

UNITED STATES PATENT AND TRADEMARK OFFICE
CERTIFICATE OF CORRECTION

PATENT NO.   : 5,773,364
DATED        : June 30, 1998
INVENTOR(S)  : Janos Farkas, et. al.

It is certified that error appears in the above-identified patent and that said Letters Patent is hereby corrected as shown below:

Column 5, line 53, delete "NH4N14", insert --NH4104--.

Column 5, line 55, delete "NH4N13", insert --NH4103--.

Signed and Sealed this

Fifteenth Day of December, 1998

Attest:

BRUCE LEHMAN

Attesting Officer         Commissioner of Patents and Trademarks